US005499629A

United States Patent [19]
Kerr et al.

[11] Patent Number: 5,499,629
[45] Date of Patent: Mar. 19, 1996

[54] SLICE PROFILE STABILIZATION FOR SEGMENTED K-SPACE MAGNETIC RESONANCE IMAGING

[75] Inventors: Adam B. Kerr, Stanford; John M. Pauly, San Francisco, both of Calif.

[73] Assignee: Board of Trustees of the Leland Stanford Junior University, Stanford, Calif.

[21] Appl. No.: 191,342

[22] Filed: Feb. 1, 1994

[51] Int. Cl.[6] ............................................. A61B 5/055
[52] U.S. Cl. ..................... 128/653.2; 324/307; 324/309
[58] Field of Search ...................... 128/653.2; 324/307, 324/309

[56] References Cited

U.S. PATENT DOCUMENTS 5,105,152  4/1992  Pauly ........................................ 324/309
5,315,249  5/1994  Le Roux et al. ........................ 324/309
5,345,176  9/1994  Le Roux et al. ........................ 324/309

OTHER PUBLICATIONS

Kerr, et al., "Slice Profile Stabilization For Segmented K–Space Imaging," Proceedings of the Society of Magnetic Resonance in Medicine, vol. 3, Aug. 14–20, 1993, p. 1189.
Ghiglia, et al., "Direct Phase Estimation From Phase Differences Using Fast Elliptic Partial Differential Equation . . . " Optics Letters, vol. 14, No. 20, Oct. 15, 1989, pp. 1107–1109.

*Primary Examiner*—Ruth S. Smith
*Attorney, Agent, or Firm*—Townsend and Townsend and Crew

[57] ABSTRACT

Selective RF pulses are applied for segmented k-space imaging sequences with the tip-angle profiles of the pulses varying for stabilizing the entire signal profile and reducing ghosting and blurring artifacts in slice images.

10 Claims, 8 Drawing Sheets

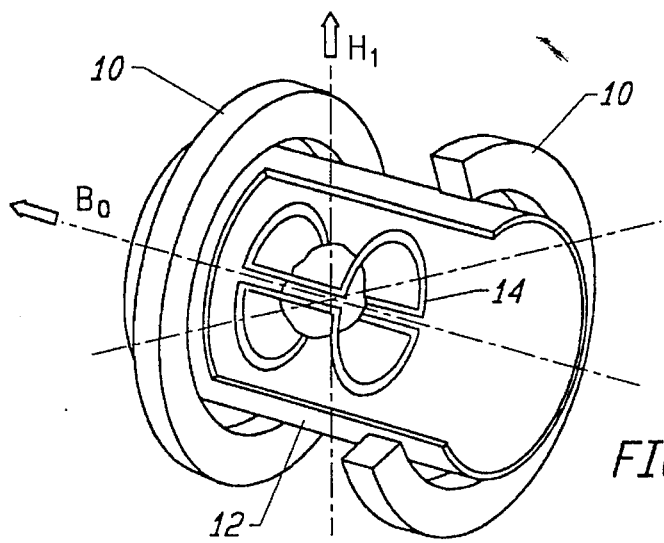
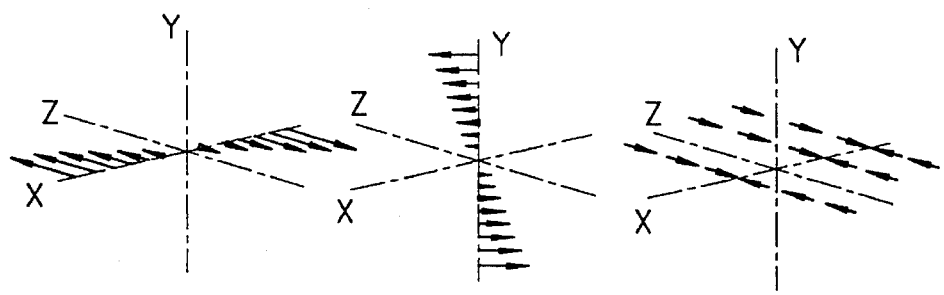
FIG. 1B    FIG. 1C    FIG. 1D
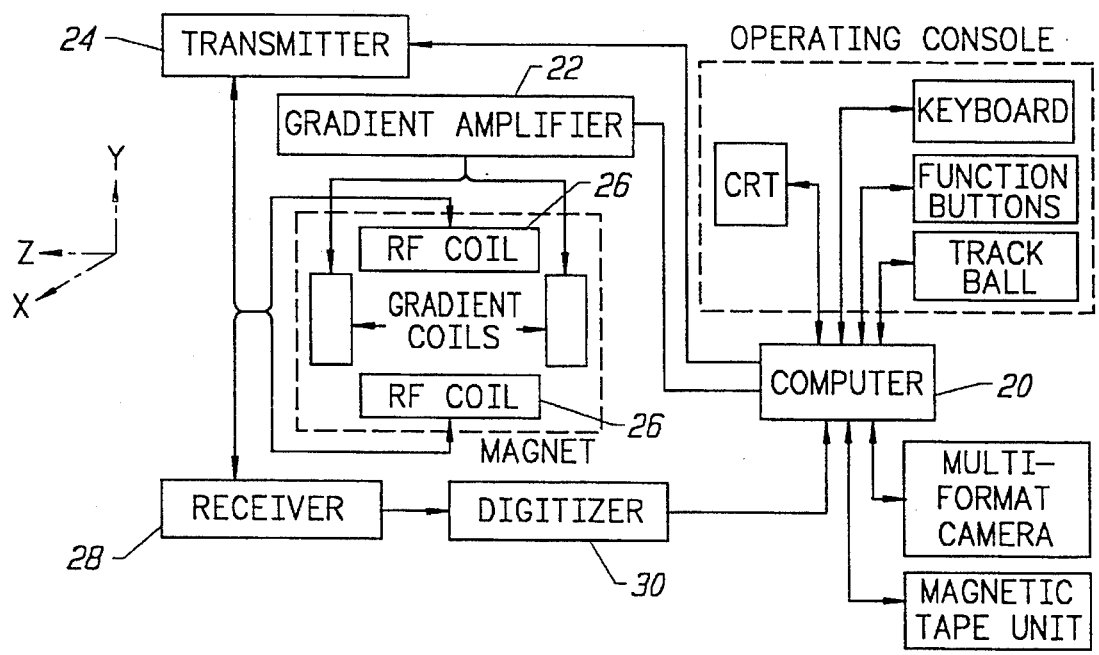
FIG. 2

SLICE PROFILE STABILIZATION FOR SEGMENTED K-SPACE MAGNETIC RESONANCE IMAGING

The U.S. Government has rights in the invention pursuant to NIH grant No. HL-39297, and NSF grant No. BCS90-58556, both to Stanford University.

BACKGROUND OF THE INVENTION

This invention relates generally to magnetic resonance imaging and more particularly the invention relates to stabilization of a selective slice profile for segmented k-space imaging.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_O$, of the precession of the nuclei is the product of the magnetic field $B_O$, and the so-called magnetogyric ratio, $\gamma$, a fundamental physical constant for each nuclear species:

$$\omega_O = B_O \cdot \gamma$$

Accordingly, by superimposing a linear gradient field, $B_z = Z \cdot G_z$, on the static uniform field, $B_O$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclear spin flip in response to an RF pulse excitation is proportional to the integral of the pulse over time.

A k-space interpretation of nuclei excitation is given by Pauly, Nishimura, and Macovski in "A k-space Analysis of Small-Tip-Angle Excitation," Journal of Magnetic Resonance 81, 43–56 (1989). They showed that multi-dimensional selective excitation in the presence of time-varying gradients can be analyzed using Fourier transform theory. Using this interpretation, they designed and implemented selective excitation pulses that are selective in two spatial dimensions. Based on a small-tip-angle approximation, selective excitation is interpreted as a weighted trajectory through k-space. The slice profile is the Fourier transform of this weighted trajectory.

Segmented k-space imaging sequences make use of a short burst of selective pulses to acquire multiple phase encodes every cycle. As there is only partial recovery of longitudinal magnetization between pulses, an amplitude modulation of the phase encodes will be incurred if the pulses are not designed to compensate.

To reduce blurring and ghosting caused by this amplitude modulation, an increasing tip-angle sequence can be used to stabilize signal level in the middle of the slice. However, significant variations in the signal profile will still occur at the edges. The present invention is directed to a method for stabilizing the entire signal profile.

SUMMARY OF THE INVENTION

In accordance with the invention, selective excitation pulses for acquiring multiple phase encodes in segmented k-space imaging have varying tip-angle profiles to achieve a constant signal profile across the selected slice.

More particularly, a sequence of either linear-phase or minimum-phase selective excitation pulses are used to stabilize the signal profile. The tip-angle profile for each pulse within the sequence is based on the spin-lattice and spin-spin relaxation times of imaged substance, and the interval between pulses.

The invention and objects and features thereof will be more readily apparent from the following description and appended claims when taken with the drawings.

BRIEF DESCRIPTION OF THE DRAWINGS

FIGS. 1A–1D illustrate the arrangement of MRI apparatus and magnetic fields generated therein.

FIG. 2 is a functional block diagram of MR imaging apparatus.

DESCRIPTION OF THE PREFERRED EMBODIMENT

Figure 3:
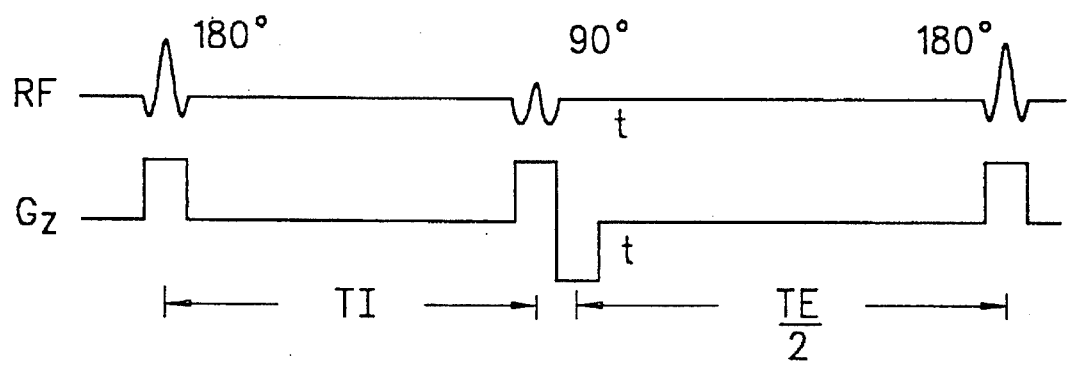
FIG. 3 illustrates a basic pulse sequence for exciting a slab for projection image.

Referring now to the drawing, FIG. 1A is a perspective view partially in section illustrating coil apparatus in NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, Mar. 1983, pp. 338–350. Briefly, the uniform static field $B_0$ is generated by the magnet comprising the coil pair 10. A gradient field $G(x)$ is generated by a complex gradient coil set which can be wound on the cylinder 12. An RF field $B_1$ is generated by a saddle coil 14. An patient undergoing imaging would be positioned along the Z axis within the saddle coil.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in NMR - A Perspective on Imaging. General Electric Company, 1982. A computer 20 is programmed to control the operation of the NMR apparatus and process FID signals detected therefrom. The gradient field is energized by a gradient amplifier 22 and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween.

As noted above, segmented k-space imaging sequences make use of a short burst of selective pulses to acquire multiple phase encodes every cycle. As there is only partial recovery of longitudinal magnetization between pulses, an amplitude modulation of the phase encodes will be incurred if the pulses are not designed to compensate.

To reduce blurring and ghosting caused by this amplitude modulation, a varying tip-angle sequence can be used to stabilize signal level in the middle of the slice. However, significant variations in the signal profile will still occur at the edges. The present invention is directed to a method for stabilizing the entire signal profile.

In accordance with the invention, selective pulses are designed to stabilize the signal profile for both conventional k-space imaging sequences as well as for fast selective inversion recovery (SIR). See, for example, Wang et al., "Fast Angiography Using Selective Inversion Recovery," Magnetic Resonance in Medicine, 23:109–121, 1992. SIR is a time-of-flight angiographic technique that differs from a conventional imaging sequence in that the image signal is the difference between two separate acquisitions. Blood is selectively inverted in one of the two acquisitions so that it does not cancel in the difference image.

It is convenient that SIR yields a simple recursive expression relating the sequential tip-angles required to achieve a constant difference-signal. Assuming that all transverse magnetization is spoiled before each pulse, these tip-angles must satisfy:

$$\tan \theta_{i-1} = e^{-TF_r/T_1} \sin \theta_i, \quad (1)$$

where $\theta_i$ is the tip-angle of the i'th pulse in the burst, $TR_R$ is the interval between pulses, and $T_1$ is the spin-lattice relaxation time of blood.

In a conventional imaging sequence, a simple recursive expression for $\theta_{i-1}$ in terms of $\theta_i$ does not exist. In this case, as a forward relation is easier to develop, we follow the method of Le Roux et al., "Stabilization of Echo Amplitudes in Rare Sequences," Magnetic Resonance in Medicine, Vol. 30, No. 2, Aug. 1993, pp. 183–190, and construct a table of signal levels vs. the progressive tip-angles. We must consider two types of sequences, those in which residual transverse magnetization is completely spoiled prior to excitation, and those which allow transverse coherences to develop. We first consider a spoiled sequence and assume a single $T_1$ species is present and is fully relaxed at the beginning of the burst of selective excitation pulses. The signal magnitude $S=|M_{xy}|$ after an initial tip of $\theta_1$ is simply $$S = M_0 \sin \theta_1 \quad (2)$$

where $M_0$ is the equilibrium magnetization. The longitudinal magnetization immediately prior to the next pulse will be $$M_z = M_0 \cos\theta_1 e^{-TR_R/T_1} + M_0(1 - e^{-TR_R/T_1}). \quad (3)$$

Assuming that all transverse magnetization is completely spoiled, then the required tip to achieve the signal magnitude S is given by $$\theta_2 = \sin^{-1}\left[\frac{S}{\cos\theta_1 e^{-TR_R/T_1} + (1 - e^{-TR_R/T_1})}\right]. \quad (4)$$

Figure 4:
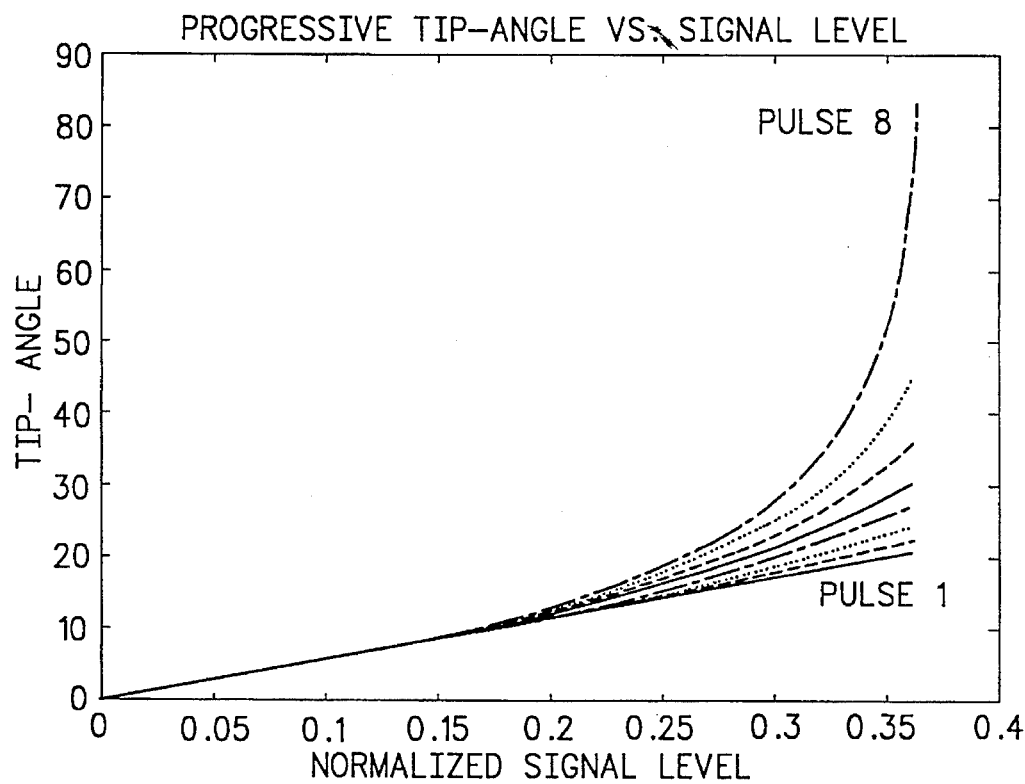
FIG. 4 is a plot of progressive tip-angles to maintain constant signal level for a conventional spoiled imaging sequence with eight pulses.

This procedure is easily repeated to determine any number of sequential tip-angles. FIG. 4 illustrates the required progressive tip-angles to achieve a constant signal level for a sequence using a burst of eight pulses. To recursively determine $\theta_{i-1}$ given $\theta_i$ for this sequence, we use spline interpolation on this tabulated data.

The second type of conventional sequence we consider are those which allow transverse coherences to develop. To analyze the effect of transverse coherences, we use the method described by Sekihara in "Steady-State Magnetizations in Rapid NMR Imaging Using Small Flip Angles and Short Repetition Intervals," IEEE Transactions on Medical Imaging, Vol. 6, No. 2, pp. 157–164, 1987. The analysis assumes that a constant phase offset is added to each isochromat within a $TR_R$ interval, and that these offsets are uniformly distributed over $0 \ldots 2\pi$ within each voxel. Essentially, this requires any phase encodes or varying gradient lobes to be rewound at the end of each $TR_R$, and that a constant gradient spoiler exist to establish the uniform 0 . . . 2π distribution of phase offsets over a voxel. A single $T_1$, $T_2$ species is also assumed.

Figure 5:
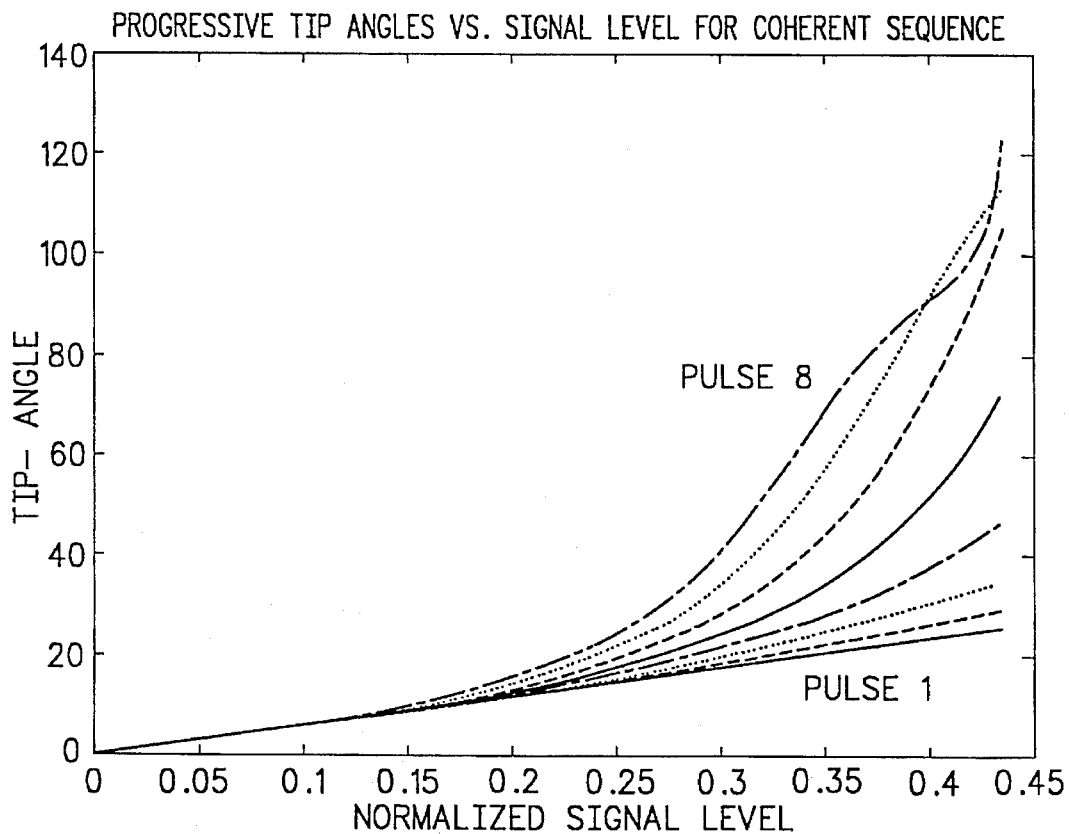
FIG. 5 is a plot of progressive tip-angles to maintain constant signal level for a conventional coherent imaging sequence with eight pulses.

Sekihara's method, supra, determines the net magnetization within a voxel immediately prior to the excitation pulse. Determining the required tip angle to yield a component $S=|M_{xy}|$ in the transverse plane after the excitation is then straightforward. FIG. 5 shows the progressive tip angles to achieve a constant signal level for brain white matter having a $T_1$ of 800ms and a $T_2$ of 100ms when using a coherent sequence.

Mugler et al. in "Shaping the Signal Response During the Approach to Steady State in Three-Dimensional Magnetization-Prepared Rapid Gradient-Echo Imaging Using Variable Flip Angles," Magnetic Resonance in Medicine, Vol. 28, pp. 165–185, 1992, and "Shaping the Signal Response of Short-TR Gradient-Echo Sequences During the Approach to Steady-State—a Technique for Improving Image Quality," Proceedings of the Society of Magnetic Resonance in Medicine, p. 847, 1991, have previously used similar methods to determine the sequence of tip angles for non-selective excitation pulses required to achieve a constant signal level in 3D sequences. They also describe how a sequence of tip angles can be chosen to yield a signal evolution that follows an exponential rise to some constant level.

Using the Shinnar-Le Roux (SLR) algorithm as discussed by Pauly et al., "Parameter Relations for the Shinnar-Le Roux Selective Excitation Pulse Design Algorithm," IEEE TMI, 10(1), 1991, a linear-phase RF pulse is designed that will be used for the last pulse in the burst, and will serve as a template for the remaining pulses. To maximize the SNR achieved by the sequence, the tip-angle of the last pulse should be 90°. If $B_1$ inhomogeneity is a concern, a smaller final tip-angle will yield slice profiles that deviate less from the template. Fortunately, FIG. 4 shows that 90% of the maximum achievable signal magnitude is still attained when using a final tip-angle of only 50°.

The SLR transform provides a unique mapping between the RF pulse and two complex polynomials $A_n(z)$ and $B_n(z)$. The polynomial $B_n(z)$ evaluated on the unit circle yields a slice profile where each point on the profile is directly proportional to the sine of half the tip-angle at that point. We perform this evaluation using a DFT of sufficient order to avoid aliasing. It is also important to ensure that any linear-phase ramp across the DFT result is corrected to yield a purely real sequence.

When designing selective pulses for SIR, the recursive relation of (1) is applied to determine the tip-angle profiles of the preceding pulses. In the case of designing pulses for the conventional imaging sequence, we first go from the tip-angle profile to a signal profile by using spline interpolation on the curve in FIG. 4 corresponding to the final pulse. We likewise use interpolation to go from this signal profile to the tip-angle profiles for each of the preceding pulses.

Given the tip-angle profiles for each pulse, the corresponding $B_{n'}(z)$ polynomials are obtained using an inverse DFT. To allow for sharper transitions in the tip-angle profiles over the template profile, the order n' of the polynomials (and hence, the duration of the pulse) can be some factor α times the initial order n. The minimum energy RF pulses are then determined from the $B_{n'}(z)$ polynomials as in Pauly et al., supra.

In situations when linear-phase across the selected slice is not required, an improved slice profile can be obtained by using a minimum-phase pulse. To design a train of minimum-phase pulses, we follow essentially the same design procedure as previously.

A minimum-phase pulse is first designed using the SLR algorithm and the complex polynomials $A_n(z)$ and $B_n(z)$ determined. This pulse will serve as both a template and the final pulse in the burst. As before, a DFT is used to evaluate $B_n(z)$ on the unit circle, yielding a profile directly proportional to the sine of half the tip-angle. The complex phase variation across this profile is removed by taking the magnitude.

The magnitude $|B_{n'}(z)|$ evaluated on the unit circle for each of the preceding pulses is then determined as previously. The associated phase for each is recovered using the fact that the log magnitude and phase of a minimum phase polynomial are a Hilbert transform pair. That is, $$B_{n'}=|B_{n'}(Z)|exp\ [iH\{log|B_{n'}(z)|\}]. \quad (5)$$

The coefficients for the $B_{n'}(z)$ polynomials are then recovered using an inverse DFT. As previously, we allow the order n' of the new polynomials $B_{n'}(z)$ to be some factor α times the initial order n. The minimum energy RF pulses are then determined from the $B_{n'}(z)$ polynomials as in Pauly et al.

Figure 6:
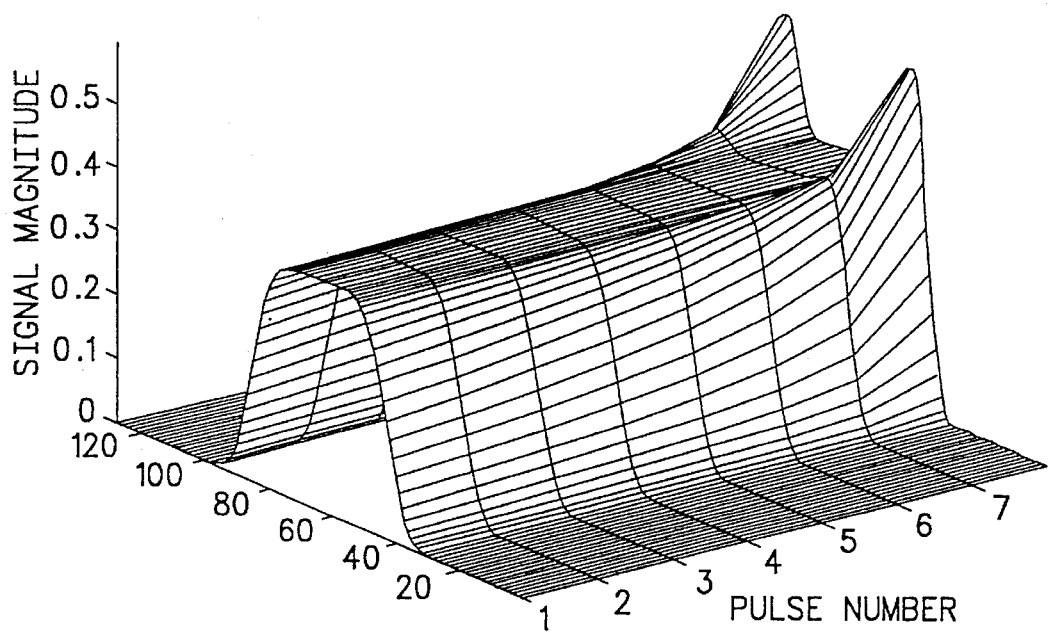
FIG. 6 is a mesh plot showing evolution of signal profile for spoiled sequence using conventional SLR designed linear-phase pulses.
Figure 7:
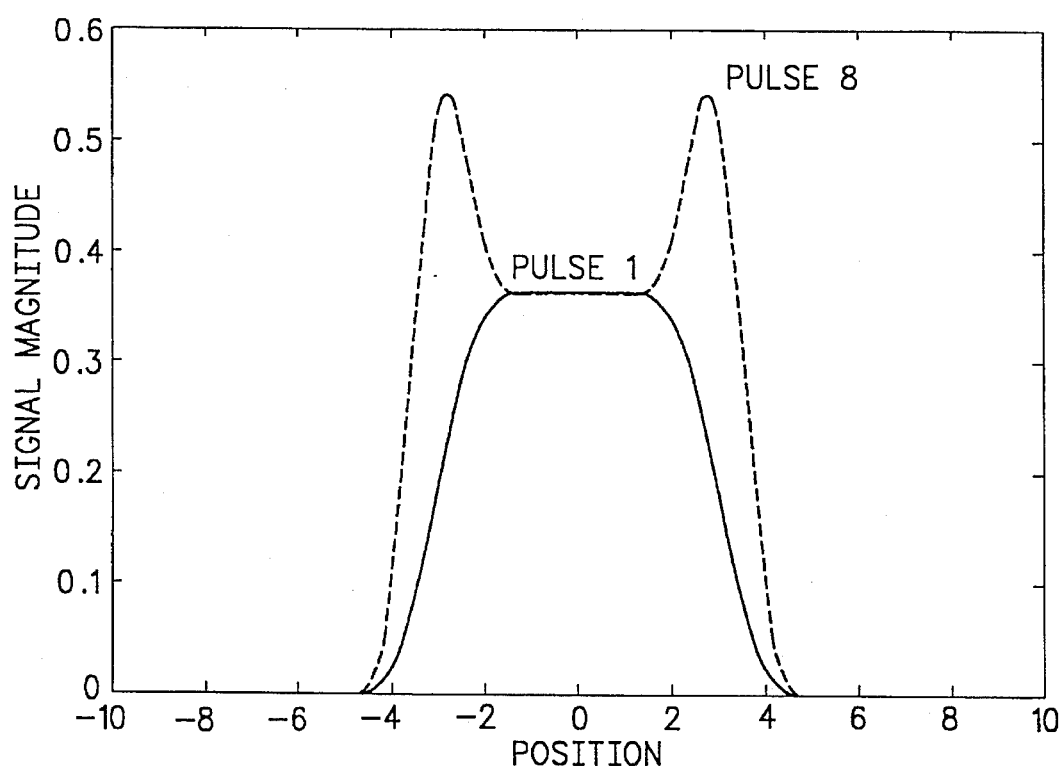
FIG. 7 is a plot of signal profiles for spoiled sequence obtained from first and eighth pulse of a train of conventional SLR designed linear-phase pulses.
Figure 8:
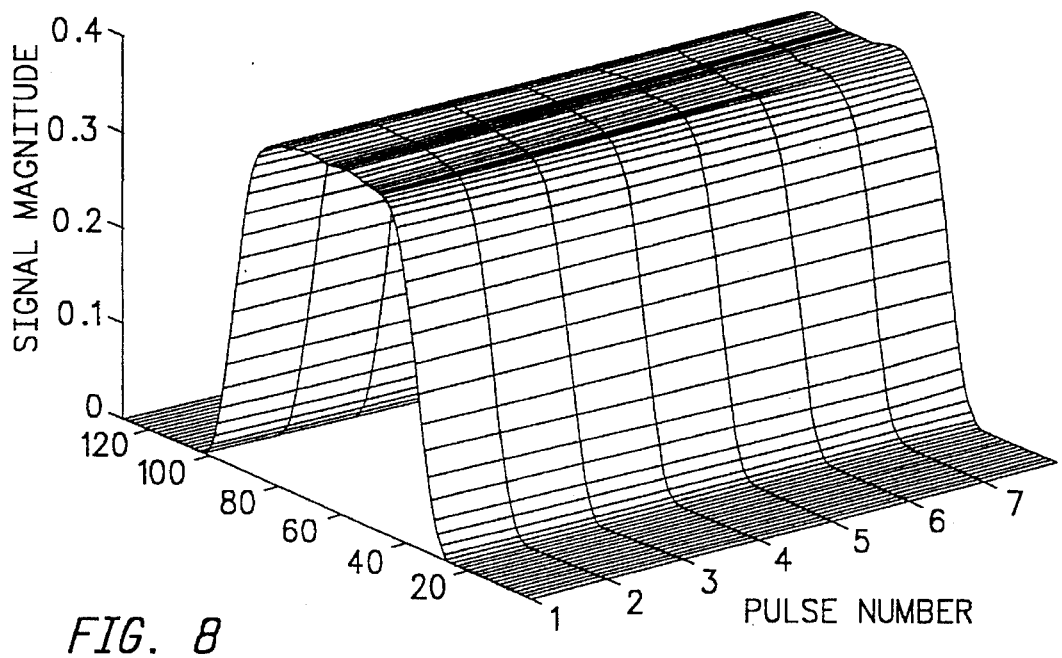
FIG. 8 is a mesh plot showing evolution of signal profile for spoiled sequence using train of linear-phase pulses designed in accordance with the invention.
Figure 9:
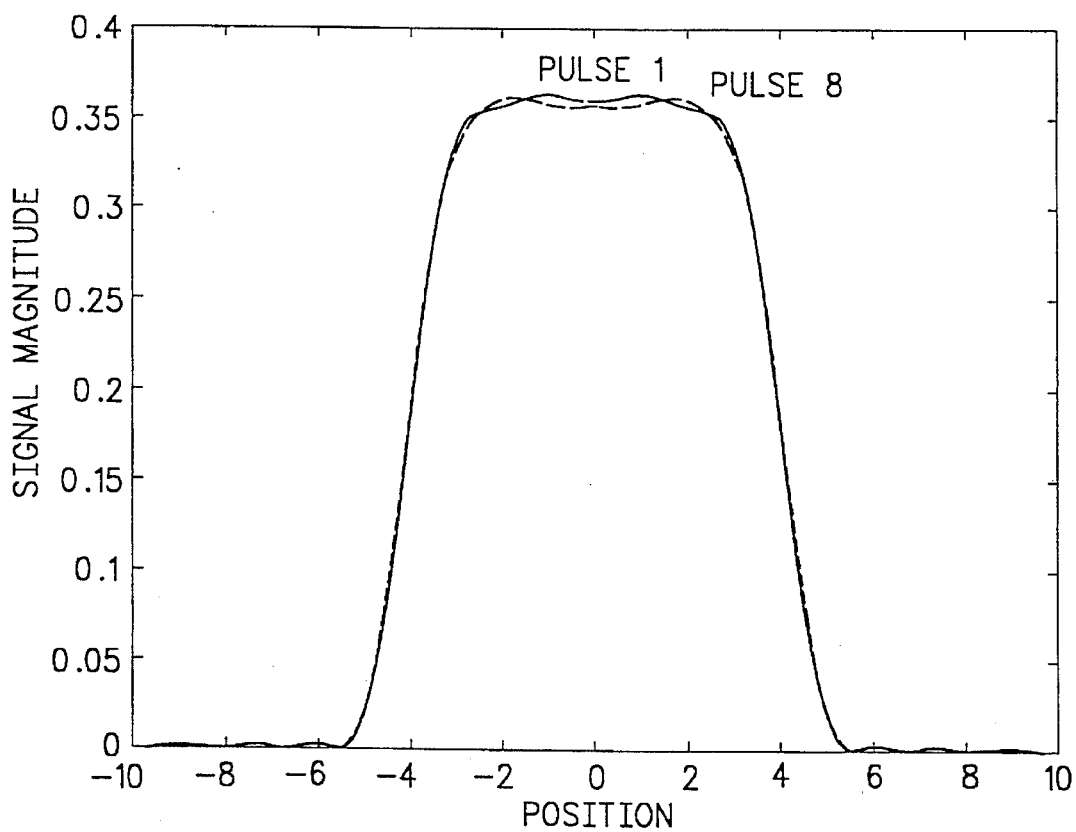
FIG. 9 is a plot of signal profiles for spoiled sequence obtained from first and eighth pulse of a train linear-phase pulses designed in accordance with the invention.
Figure 10:
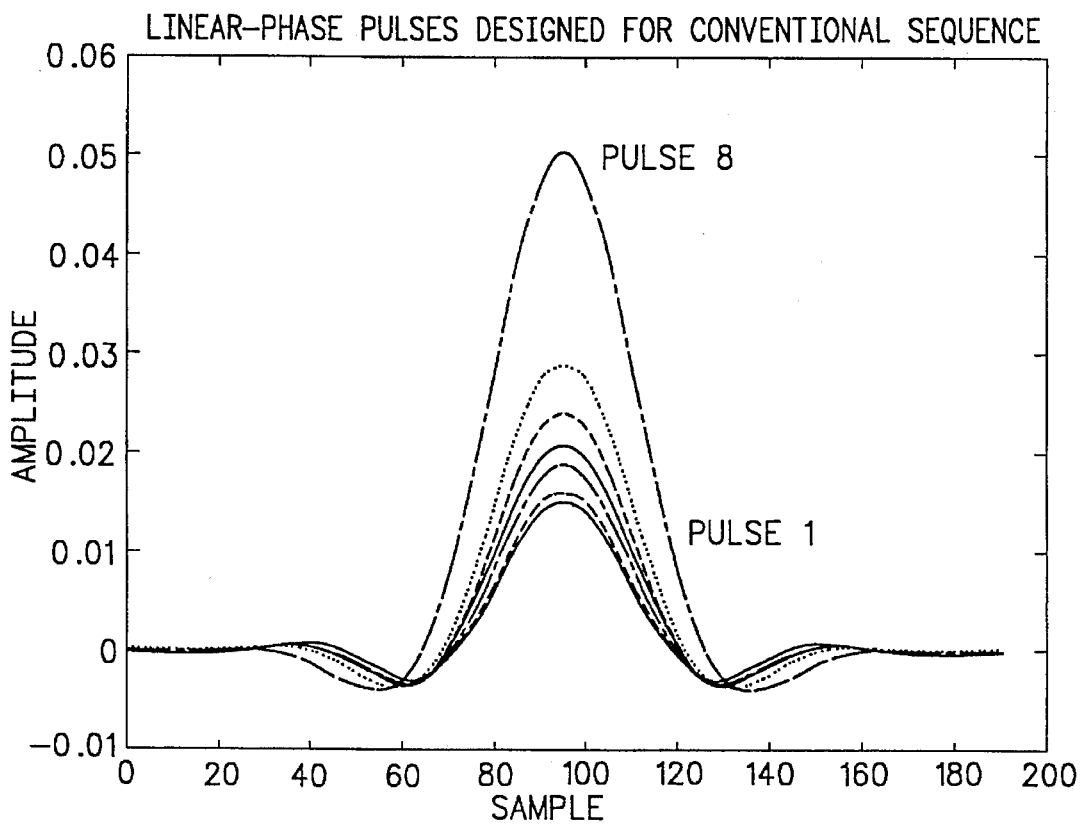
FIG. 10 illustrates a train of 8 linear-phase pulses designed to stabilize signal profile for conventional spoiled sequence.

The signal profiles for a train of eight conventional SLR designed linear-phase pulses with nominal tip-angles going from approximately 20° to 90° and time-bandwidth of 6 were determined through simulation. The exact tip-angles were determined using the data plotted in FIG. 4, and the simulation assumed a $T_1$ of 900 ms and a $TR_R$ of 17 ms. FIG. 6 is a mesh plot showing the evolution of the signal profile over the 8 pulses. FIG. 7 is a plot of the signal profiles from just the first and the eighth pulses. We remark that there are significant lobes at the edges of the profile for the eighth pulse. In contrast FIGS. 8 and 9 present the signal profiles obtained when the train of linear-phase pulses were designed using our method. The time-bandwidth of the template pulse was chosen to be 4, but α was set to 1.5 so the actual pulses for each of the two methods were of the same duration. Note the significantly improved overlay of the signal profiles from the first and eighth pulse shown in FIG. 9. The train of linear-phase pulses that we designed are shown in FIG. 10. It is clear that more than scaling differences exist between these pulses.

Figure 11:
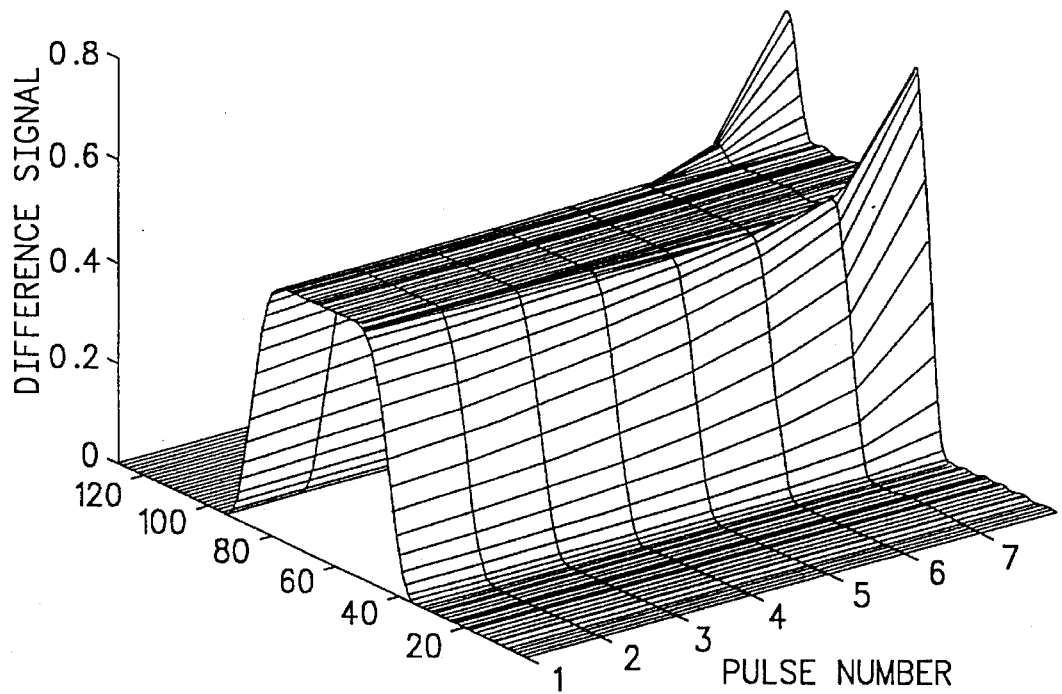
FIG. 11 is a mesh plot showing evolution of a difference-signal profile for a SIR sequence when using a train of conventional SLR designed minimum-phase pulses.
Figure 12:
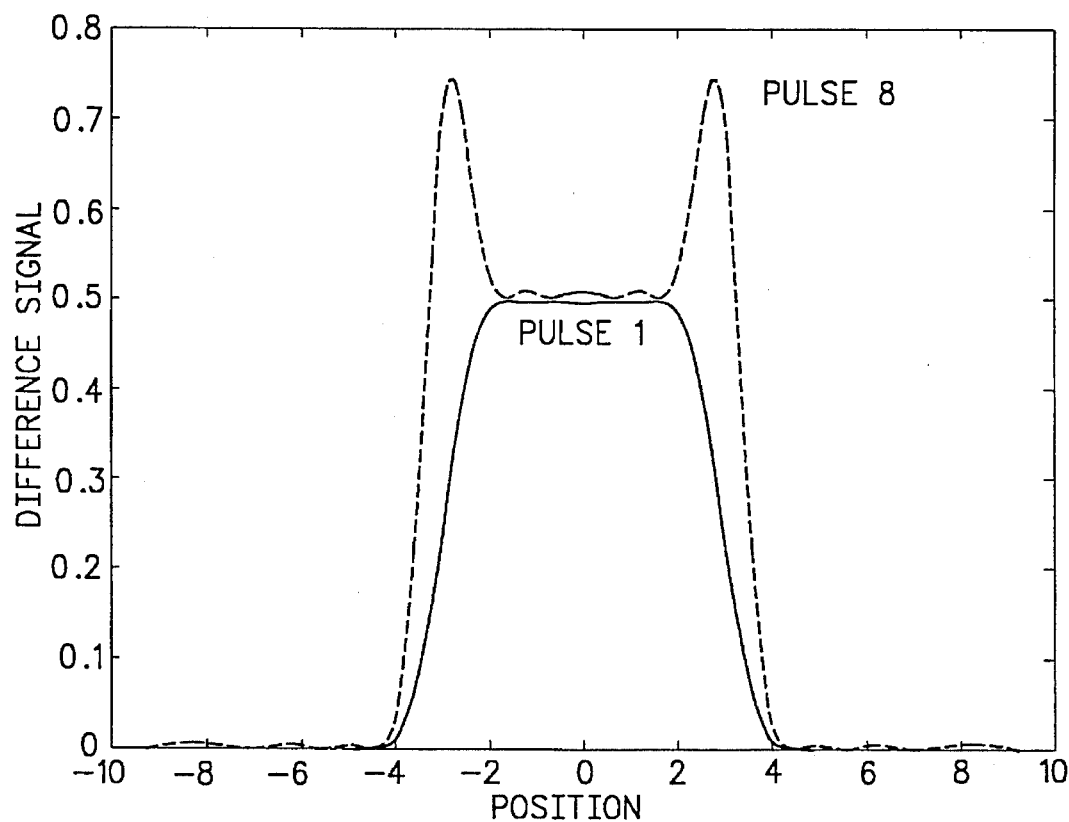
FIG. 12 is a plot of difference-signal profiles obtained from first and eighth pulse of a SIR sequence when using a train of conventional SLR designed minimum-phase pulses.

FIGS. 11 and 12 illustrate the difference-signal profiles simulated for a SIR sequence when a train of 8 conventional SLR designed minimum-phase pulses of timebandwidth 6 with nominal tip-angles satisfying (1) and a final tip-angle of 90°. We assumed a $T_1$ of 1s (for blood) and a $TR_R$ of 13 ms. We remark again on the significant lobes appearing at the sides of the difference signal profile.

Figure 13:
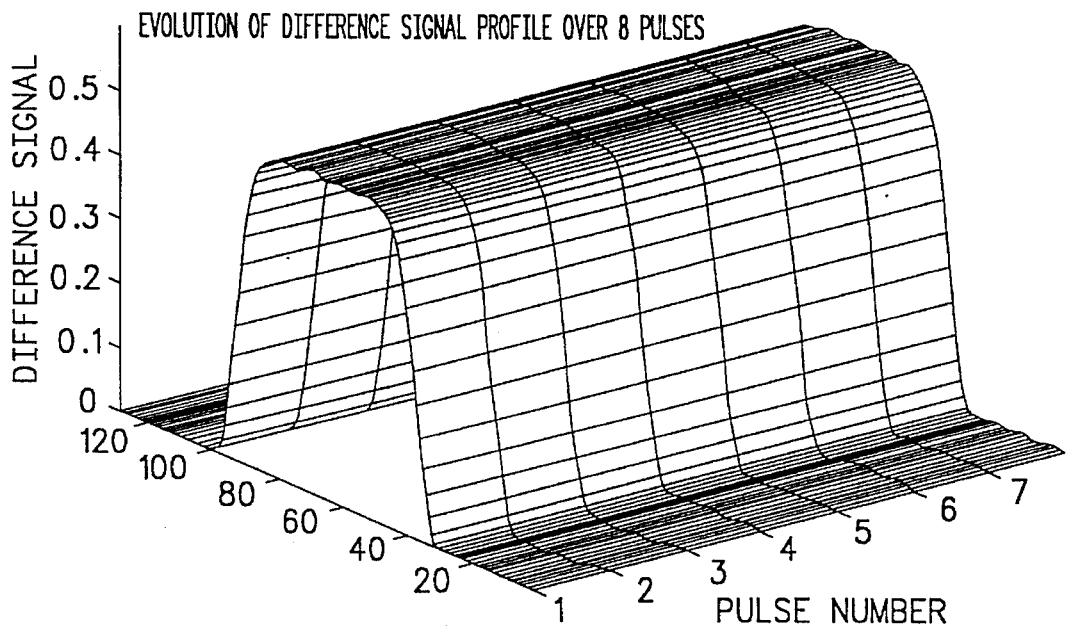
FIG. 13 is a mesh plot showing evolution of difference-signal profile from a SIR sequence when using a train of minimum-phase pulses designed according to the invention.
Figure 14:
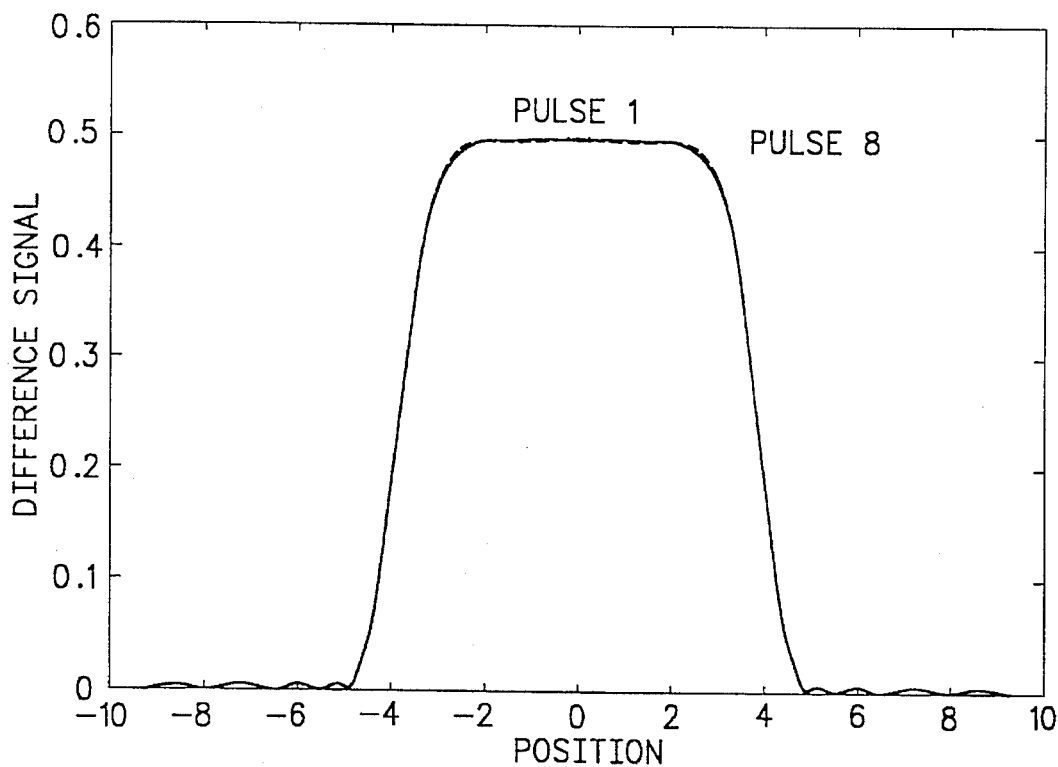
FIG. 14 is a plot of difference-signal profiles obtained from first and eighth pulse of SIR sequence when using a train of minimum-phase pulses designed in accordance with the invention.
Figure 15:
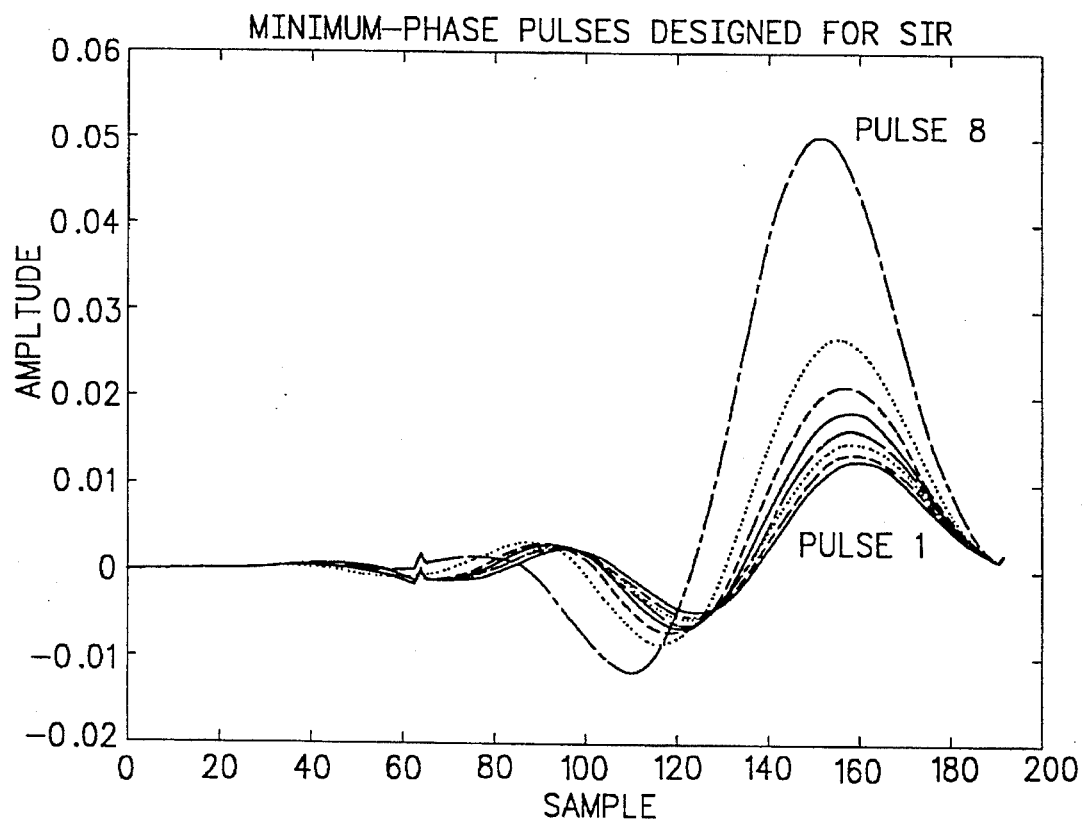
FIG. 15 is a plot of a train of 8 minimum-phase pulses designed to stabilize difference-signal profile for SIR imaging sequence.

FIGS. 13 and 14 illustrate the near perfect match of the difference-signal profiles obtained when using a train of minimum-phase pulses designed using our method. The train of these minimum-phase pulses are shown in FIG. 15.

In summary, simulations of the evolution of the signal profile for segmented k-space imaging sequences show significant variations in the profile from pulse to pulse. These variations are most pronounced for the later pulses in the sequence. We have demonstrated that both linear-phase and minimum-phase pulses can be designed to stabilize the signal profiles, which should reduce ghosting and blurring artifacts. The design procedures we have described may also be directly applied towards designing a longer sequence of selective pulses (say 128 or 256) to stabilize the signal profile for standard Gradient Recalled Echo or spoiled Gradient Recalled Echo sequences.

While the invention has been described with reference to specific embodiments, the description is illustrative of the invention and is not to be construed as limiting the invention. Various modifications and applications may occur to

What is claimed is:

1. A method of obtaining magnetic resonance imaging signals comprising the steps of
   a) placing an object to be imaged in a magnetic field ($B_0$),
   b) applying a plurality of RF excitation pulses to said object to selectively excite nuclei in a slice through said object, one pulse of said plurality of RF excitation pulses serving as a template for other RF excitation pulses with said plurality of RF excitation pulses having varying tip-angle profiles for said nuclei whereby a stabilized signal profile is realized and wherein a tip-angle profile for the last pulse in the plurality of RF pulses is given, the required sequence of tip-angles to achieve a given signal level for all possible signal levels is known, and the tip-angle profiles $\theta_{i-1}(x)$ for pulse i–1 are recursively determined from a known tip-angle profile $\theta_i(x)$ for pulse i, beginning with the last tip-angle profile, and
   c) detecting said signals from said nuclei.

2. The method as defined by claim 1 wherein the RF pulses are part of a selective inversion recovery (SIR) sequence and the relation between $\theta_{i-1}(x)$ and $\theta_i(x)$ is as follows:

$$tan\theta_{i-1}(x) = e^{-TR_R/T_1} sin\theta_i(x)$$

where $T_1$ is the spin-lattice relaxation time of material in said object to be imaged, and $TR_R$ is the interval between pulses.

3. The method as defined by claim 1 wherein steps b) effectively suppresses or spoils all transverse magnetization prior to each pulse whereby the relation between tip-angle profiles $\theta_i(x)$ and $\theta_{i-1}(x)$ is then based on the spin-lattice relaxation time of an imaged substance, the $TR_R$ internal between pulses, and all proceeding pulse tip-angle profiles $\theta_j(x)$, j=1 ... i–1.

4. The method as defined by claim 1 wherein an imaging sequence using the RF pulses causes a constant phase offset to be felt by each isochromat within the selected slice without spoiling all transverse magnetization prior to each pulse, the unrewound gradients during each $TR_R$ producing at least several $\pi$ variations in the phase offset incurred between isochromats within an imaged voxel, and the relation between tip-angle profiles $\theta_i(x)$ and $\theta_{i-1}(x)$ is based on the spin-lattice and spin-spin relaxation times of the imaged substance, the $TR_R$ interval between pulses, and all proceeding pulse tip-angle profiles $\theta_j(x)$, j=1 ... i–1.

5. The method as defined by claim 1 wherein the last pulse of said plurality of pulses is designed using a Shinnar-Le Roux algorithm to provide a linear-phase RF pulse having a unique mapping with two complex polynomials $A_n(z)$ and $B_n(z)$, said $B_n(z)$ polynomial providing by discrete Fourier transform a slice profile where each point on a profile of said slice is directly proportional to sine of half the tip-angle at the point.

6. The method as defined by claim 5 wherein a linear-phase pulse is obtained from the tip-angle profile for each pulse using a functional interpolation.

7. The method as defined by claim 1 wherein the last pulse of said plurality of pulses is designed using a Shinnar-Le Roux algorithm to provide a minimum-phase RF pulse having a unique mapping with two complex polynomials $A_n(z)$ and $B_n(z)$, said $B_n(z)$ polynomial providing by discrete Fourier transform a slice profile where each point on a profile of said slice is directly proportional to sine of half the tip-angle at the point.

8. The method as defined by claim 7 wherein a minimum phase pulse is obtained from the tip-angle profile for each pulse using a functional interpolation.

9. Apparatus for obtaining magnetic resonance imaging signals comprising
   a) means for establishing a magnetic field, $B_O$, through an object to be imaged,
   b) means for applying a plurality of RF excitation pulses to said object to selectively excite nuclei in a slice through said object, said plurality of RF pulses having varying tip-angle profiles for said nuclei whereby a stabilized signal profile is realized, and the tip-angle, $\theta_i$, for pulse, i, is related to the tip angle, $\theta_{i-1}$, for a preceding pulse, i–1, as follows:

$$tan\ \theta_{i-1}(x) = e^{-TR_R/T_1} sin\ \theta_i(x)$$

where $T_1$ is the spin-lattice relaxation time of material in said object to be imaged, and $TR_R$ is the interval between pulses, and c) means for detecting said signals from said nuclei.

10. The apparatus as defined by claim 9 wherein the last pulse of said plurality of pulses is designed using a Shinnar-Le Roux algorithm to provide a linear-phase RF pulse having a unique mapping with two complex polynomials $A_n(z)$ and $B_n(z)$, said $B_n(z)$ polynomial providing by discrete Fourier transform a slice profile where each point on a profile of said slice is directly proportional to sine of half the tip-angle at the point.

* * * * *